(12) United States Patent
Kim et al.

(10) Patent No.: US 8,300,166 B2
(45) Date of Patent: Oct. 30, 2012

(54) DISPLAY PANEL AND METHOD OF MANUFACTURING THE SAME

(75) Inventors: Chul-Ho Kim, Yongin-si (KR);
Jae-Beom Choi, Suwon-si (KR);
Young-Il Kim, Suwon-si (KR);
Doo-Hyung Woo, Anyang-si (KR)

(73) Assignee: Samsung Display Co., Ltd., Yongin (KR)

( * ) Notice: Subject to any disclaimer, the term of this patent is extended or adjusted under 35 U.S.C. 154(b) by 966 days.

(21) Appl. No.: 12/249,834

(22) Filed: Oct. 10, 2008

(65) Prior Publication Data

US 2009/0147165 A1 Jun. 11, 2009

(30) Foreign Application Priority Data

Dec. 10, 2007 (KR) .................. 10-2007-0127685

(51) Int. Cl.
*G02F 1/1343* (2006.01)
*H01L 21/84* (2006.01)
(52) U.S. Cl. .................. 349/39; 349/144; 438/155
(58) Field of Classification Search ............. 349/38–39, 349/139–144, 54, 187; 438/155; 257/E21.1
See application file for complete search history.

(56) References Cited

U.S. PATENT DOCUMENTS 7,671,932 B2 * 3/2010 Ohta et al. ............... 349/55
2007/0242206 A1 * 10/2007 Yoon ........................ 349/141

FOREIGN PATENT DOCUMENTS

| JP | 411007046 | * | 1/1999 |
| JP | 2006072088 | | 3/2006 |
| KR | 1020040082487 | | 9/2004 |
| KR | 1020070056165 | | 5/2007 |
| WO | WO 2006/100861 | * | 9/2006 |

* cited by examiner

*Primary Examiner* — Uyen Chau N Lee
*Assistant Examiner* — Michael Mooney
(74) *Attorney, Agent, or Firm* — H.C. Park & Associates, PLC

(57) ABSTRACT

A display panel includes a gate line dividing a pixel region into a first region and a second region and including a gate electrode, a data line crossing the gate line and including a source electrode, a thin film transistor connected to the gate line and the data line and including the gate electrode, the source electrode, and a drain electrode facing the source electrode, a protective layer disposed on the thin film transistor and comprising a first contact hole and a second contact hole, and first and second sub-pixel electrodes disposed on the first and second regions of the divided pixel region, respectively. The drain electrode is directly connected to the first sub-pixel electrode through the first contact hole, and the drain electrode is directly connected to the second sub-pixel electrode through the second contact hole.

4 Claims, 8 Drawing Sheets

DISPLAY PANEL AND METHOD OF MANUFACTURING THE SAME

CROSS-REFERENCE TO RELATED APPLICATION

This application claims priority from and the benefit of Korean Patent Application No. 10-2007-0127685, filed on Dec. 10, 2007, which is hereby incorporated by reference for all purposes as if fully set forth herein.

BACKGROUND OF THE INVENTION

1. Field of the Invention

The present invention relates to a display panel and a method of manufacturing the display panel and, more particularly, to a multi-domain display panel that may have an increased aperture ratio and improved yield and performance, and a method of manufacturing the same.

2. Discussion of the Background

A liquid crystal display (LCD) device includes a thin film transistor (TFT) substrate including a plurality of thin film transistors, a color filter substrate including a plurality of color filters, and a liquid crystal layer, which has dielectric anisotropy, disposed between the TFT substrate and the color filter substrate. A desired image is displayed on the LCD by controlling the intensity of an electric field to adjust the amount of visible light passing through the color filter substrate.

In the LCD device, the image quality may differ according to the direction in which the light is transmitted due to the anisotropy of the liquid crystal molecules. Since the LCD device displays an image when light is transmitted in a direction that is not shielded by the liquid crystal molecules, it has a drawback in that the viewing angle may be relatively narrower than other display devices. Accordingly, a vertically aligned (VA) mode LCD has been developed to realize a wide viewing angle.

Types of VA mode LCDs include a patterned VA (PVA) mode LCD, in which a pixel electrode and a common electrode are patterned into a plurality of domains, a multi-domain VA (MVA) mode LCD, in which a projection is disposed on the pixel electrode and the common electrode, respectively, to divide the electrodes into a plurality of domains, and the like. Moreover, a multi-domain PVA (MPVA) mode LCD, in which the pixel electrode is patterned into a plurality of domains and a cut portion is disposed on the common electrode, has been developed.

The conventional MPVA mode LCD includes a bridge electrode, which may be made of the same material as sub-pixel electrodes in the middle thereof, to apply a data voltage to the sub-pixel electrodes disposed on both sides of a pixel region. However, it may be necessary for the bridge electrode to have a width of less than 6 μm to prevent malfunction of the liquid crystal molecules, and thus an etching defect may occur due to a mask misalignment during the formation of the bridge electrode. Moreover, the bridge electrode may be damaged when a spacer is disposed on the bridge electrode.

SUMMARY OF THE INVENTION

The present invention provides a display panel and a method of manufacturing the same that may prevent an etching defect and a display defect by directly connecting a drain electrode of a thin film transistor to a plurality of sub-pixel electrodes disposed in each domain without a bride electrode.

Additional features of the invention will be set forth in the description which follows, and in part will be apparent from the description, or may be learned by practice of the invention.

The present invention discloses a display panel including a gate line dividing a pixel region into a first region and a second region and including a gate electrode, a data line crossing the gate line and including a source electrode, a thin film transistor connected to the gate line and the data line and including the gate electrode, the source electrode, and a drain electrode facing the source electrode, a protective layer disposed on the thin film transistor and comprising a first contact hole and a second contact hole, a first sub-pixel electrode disposed on the first region of the divided pixel region, and a second sub-pixel electrode disposed on the second region of the divided pixel region. The drain electrode is directly connected to the first sub-pixel electrode through the first contact hole, and the drain electrode is directly connected to the second sub-pixel electrode through the second contact hole.

The present invention also discloses a method of manufacturing a display panel. The method includes forming a gate line to divide a pixel region into a first region and a second region, forming a data line that is insulated from the gate line, forming a thin film transistor at a crossing of the gate line and the data line, forming a protective layer on the thin film transistor, forming a first contact hole penetrating the protective layer, the drain electrode of the thin film transistor being directly connected to the first sub-pixel electrode through the first contact hole, forming a second contact hole penetrating the protective layer, the drain electrode of the thin film transistor being directly connected to the second sub-pixel electrode through the second contact hole, forming a first sub-pixel electrode on the protective layer and in the first region of the divided pixel region, and forming a second sub-pixel electrode on the protective layer and in the second region of the divided pixel region.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
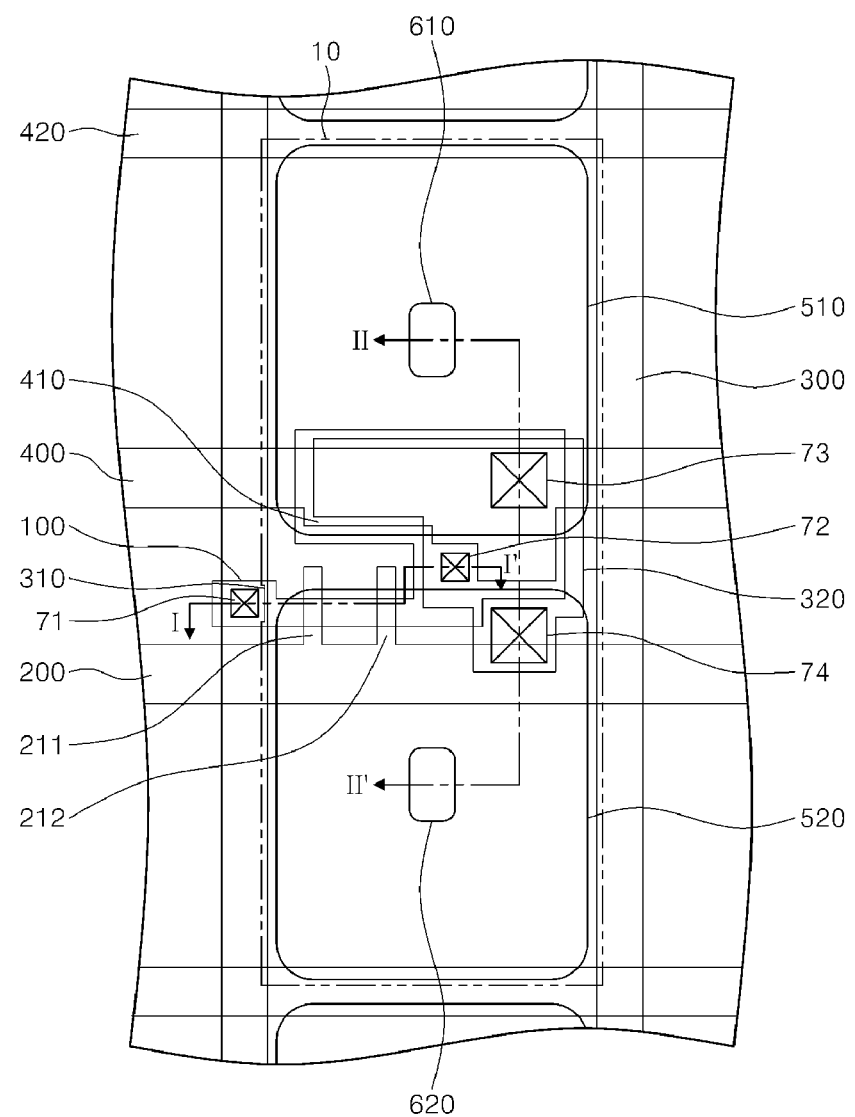
FIG. 1 is a plan view of a liquid crystal display (LCD) panel in accordance with an exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

Figure 2:
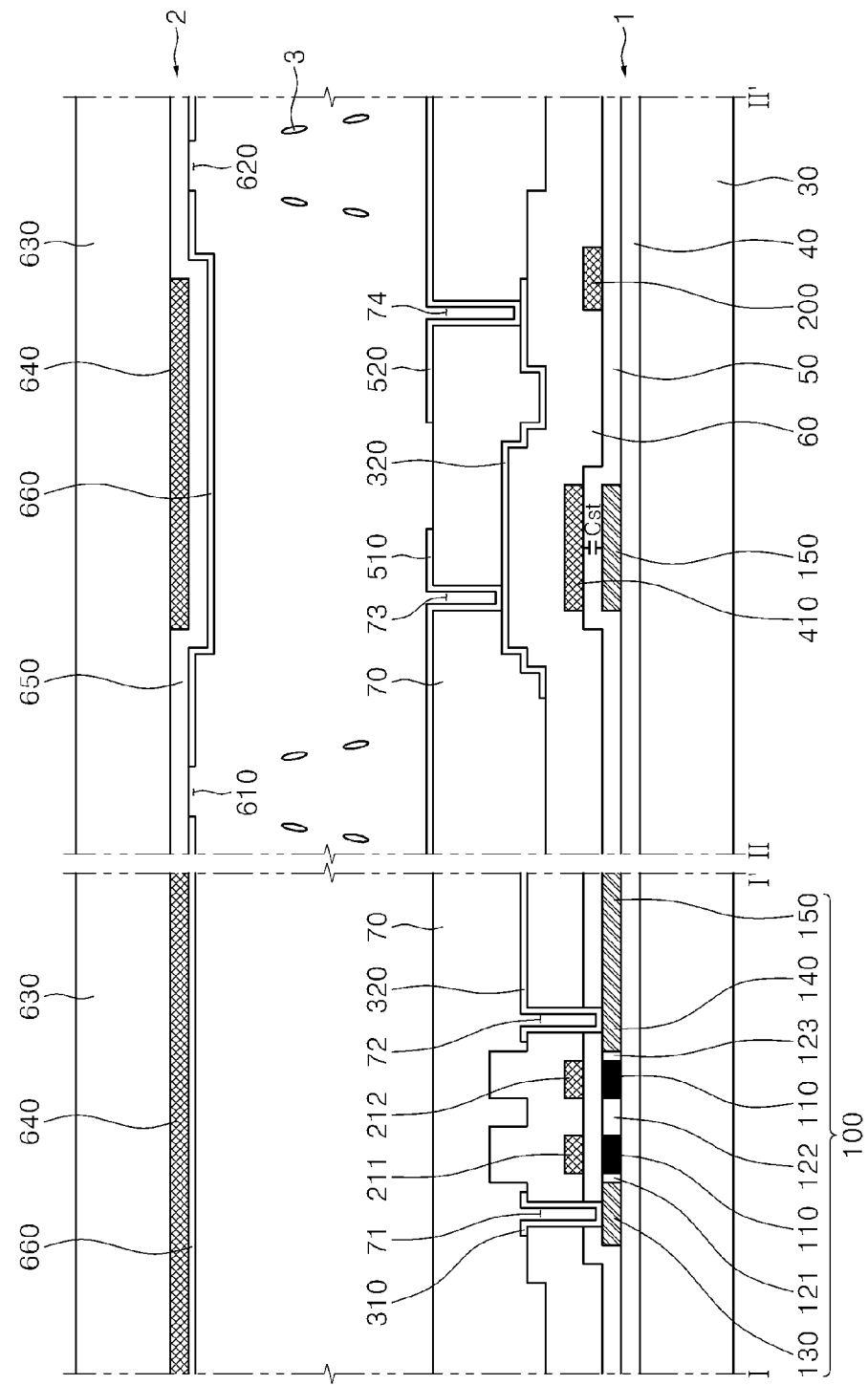
FIG. 2 is a cross-sectional view taken along lines I-I' and II-II' of the LCD panel of FIG. 1.

FIG. 1 is a plan view of a liquid crystal display (LCD) panel in accordance with an exemplary embodiment of the present invention, and FIG. 2 is a cross-sectional view taken along lines I-I' and II-II' of the LCD panel of FIG. 1.

Referring to FIG. 1 and FIG. 2, the LCD panel in accordance with the exemplary embodiment of the present invention includes a liquid crystal layer 3, and first and second substrates 1 and 2 facing each other with the liquid crystal layer 3 disposed therebetween.

In particular, the liquid crystal layer 3 is vertically aligned between the first and second substrates 1 and 2.

The first substrate 1 includes a first insulating substrate 30, a gate line 200, a data line 300, a thin film transistor (TFT), a storage line 400, a storage electrode 410, a first sub-pixel electrode 510, and a second sub-pixel electrode 520.

The gate line 200 is provided to cross a pixel region 10 so as to divide the pixel region 10 into two regions. The data line 300 is arranged to cross the gate line 200. The gate line 200 may be provided in the middle of the pixel region 10 or in a region adjacent to the middle of the pixel region 10.

The TFT includes first and second gate electrodes 211 and 212, a source electrode 310 connected to the data line 300, a drain electrode 320 connected to the first and second sub-pixel electrodes 510 and 520, and an active layer 100 that forms a channel between the source electrode 310 and the drain electrode 320.

The first and second gate electrodes 211 and 212 protrude vertically from the gate line 200 and operate the TFT according to a gate signal applied from the gate line 200. In this case, there are two gate electrodes, the first and second gate electrodes 211 and 212, in order to suppress a kink phenomenon that may occur due to a sudden increase in a drain current at a high drain voltage. Alternatively, there may be only one gate electrode if the kink phenomenon can be sufficiently suppressed by one gate electrode. On the other hand, a third gate electrode may be added if the kink phenomenon cannot be suppressed by the first and second gate electrodes 211 and 212.

The source electrode 310 protrudes vertically from the data line 300 and supplies a data signal applied from the data line 300 to the drain electrode 320 via the active layer 100.

One side of the drain electrode 320 faces the source electrode 310 with the first and second gate electrodes 211 and 212 disposed therebetween, and the other side of the drain electrode 320 is connected to the first and second sub-pixel electrodes 510 and 520 and supplies the data signal applied from the data line 300 to the first and second sub-pixel electrodes 510 and 520. The drain electrode 320 may be arranged to overlap at least a portion of the first and second sub-pixel electrodes 510 and 520. The drain electrode 320 may be arranged to overlap the storage line 400 or an active extension portion 150.

The active layer 100 is disposed on the first insulating substrate 30 with a buffer insulating layer 40 disposed therebetween. The active layer 100 includes a channel region 110 that overlaps the first and second gate electrodes 211 and 212, and first, second, and third lightly-doped drain (LDD) regions 121, 122, and 123 that are in contact with the sides of the channel region 110.

The channel region 110 forms a channel of the TFT. The first, second, and third LDD regions 121, 122, and 123 have n-impurities injected therein and reduce an off current.

The active layer 100 may further include a source contact region 130 and a drain contact region 140, into which n+ impurities are injected. The source contact region 130 is connected to the source electrode 310 through a source contact hole 71 that penetrates an interlayer insulating layer 60 and a gate insulating layer 50. The drain contact region 140 is connected to the drain electrode 320 through a drain contact hole 72 that penetrates the interlayer insulating layer 60 and the gate insulating layer 50.

The first sub-pixel electrode 510 is disposed in an upper portion of the pixel region 10 and on an organic protective layer 70. The first sub-pixel electrode 510 is connected to the drain electrode 320 through a first contact hole 73 penetrating the organic protective layer 70 to receive a data signal. The first contact hole 73 may be disposed in a region where the drain electrode 320 overlaps the first sub-pixel electrode 510.

The second sub-pixel electrode 520 is disposed in a lower portion of the pixel region 10 and on the organic protective layer 70. The second sub-pixel electrode 520 is connected to the drain electrode 320 through a second contact hole 74 that penetrates the organic protective layer 70 to receive a data signal. The second contact hole 74 may be disposed in a region where the drain electrode 320 overlaps the second sub-pixel electrode 520. In this case, the first and second sub-pixel electrodes 510 and 520 are spaced apart from each other to form first and second domains, respectively.

Since the first and second sub-pixel electrodes 510 and 520 are connected to the drain electrode 320 through the first and second contact holes 73 and 74, respectively, a bridge electrode to connect the first and second sub-pixel electrodes 510 and 520 is omitted. Accordingly, it may be possible to prevent an etching defect caused during the etching of the bridge electrode and further prevent the bridge electrode from being damaged during the later formation of a spacer.

A storage capacitor Cst is formed by overlapping the storage electrode 410 and the active extension portion 150 with the gate insulating layer 50 disposed therebetween.

The storage electrode 410 protrudes from the storage line 400 arranged parallel to the gate line 200. Since the active extension portion 150 is connected to the drain electrode 320, the storage capacity can be increased. In the case where the storage capacitor Cst is formed by overlapping the storage electrode and the first sub-pixel electrode with the interlayer insulating layer and the organic protective layer disposed therebetween, the distance between the two electrodes may be too far, and thus the storage capacity may be reduced.

Moreover, the storage capacitor Cst may be formed by overlapping the storage electrode 410 and the drain electrode 320 with the interlayer insulating layer disposed therebetween.

The storage line 400 and the storage electrode 410, as shown in FIG. 1 and FIG. 2, may be disposed on the bottom of the gate line 200. In this case, the second sub-pixel electrode 520 may be arranged to overlap the storage electrode 410.

The display panel in accordance with the exemplary embodiment of the present invention may further include a second storage line 420 disposed between the previous pixel region and the current pixel region 10.

The second storage line 420 may be arranged to overlap the first sub-pixel electrode 510 of the current pixel region 10.

Moreover, the second storage line 420 may be supplied with a storage voltage. Further, the second storage line 420 may be floated.

The second storage line 420 may separate the previous pixel region 10 from the current pixel region 10 and prevent light leakage from the adjacent pixel region.

The second substrate 2 includes a second insulating substrate 630, a black matrix 640, a color filter 650, a common electrode 660, and first and second cut portions 610 and 620.

The black matrix 640 is disposed on the second insulating substrate 630 and overlaps the gate line 200, the data line 300, the TFT, the storage line 400, and the storage electrode 410 disposed on the first substrate 1, in order to prevent light leakage. The black matrix 640 may include an opaque metal or an organic material.

The color filter 650 displays colors by including red, green, and blue color resins in the pixel region 10. The color filter 650 may be arranged to overlap the black matrix 640.

The common electrode 660 is disposed on the black matrix 640 and the color filter 650. The first cut portion 610 is disposed in a region where the common electrode 660 overlaps the center of the first sub-pixel electrode 510, and the second cut portion 620 is disposed in a region where the common electrode 660 overlaps the center of the second sub-pixel electrode 520.

When a data signal is applied to the first and second sub-pixel electrodes 510 and 520, the first and second cut portions 610 and 620 form a fringe field to drive the liquid crystal layer 3. The first and second cut portions 610 and 620 may have the same shape as that of the edge of the first and second sub-pixels 510 and 520 to produce the equal electric fields in the pixel region.

To prevent a step difference caused by the color filter 650 and the black matrix 640, an over coat layer (not depicted) may further be provided between the common electrode 660, the color filter 650, and the black matrix 640.

A method of manufacturing of an LCD panel in accordance with another exemplary embodiment of the present invention will be described with reference to FIG. 3, FIG. 4, FIG. 5, FIG. 6, FIG. 7, and FIG. 8. The following provides a description of a method of manufacturing a first substrate having a thin film transistor array in the LCD panel in accordance with the exemplary embodiment of the present invention.

Figure 3:
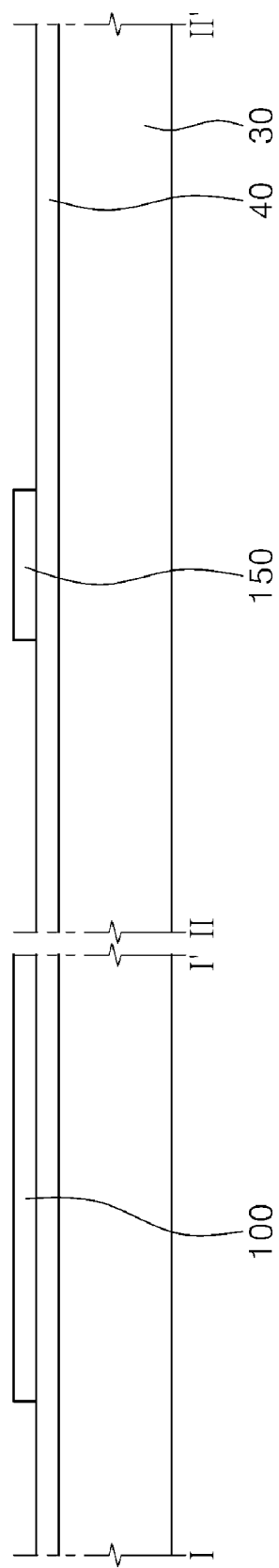
FIG. 3, FIG. 4, FIG. 5, FIG. 6, FIG. 7, and FIG. 8 are cross-sectional views showing a method of manufacturing the thin film transistor (TFT) substrate of the LCD panel of FIG. 1.

Referring to FIG. 3, a buffer insulating layer 40 is formed on a first insulating substrate 30, and an integrated active layer 100 is formed thereon by a first mask process.

In particular, the buffer insulating layer 40 is formed by depositing an inorganic insulating material such as silicon nitride ($SiN_x$) or silicon oxide ($SiO_x$) on the entire surface of the insulating substrate 30 and prevents impurities of the insulating substrate 30 from diffusing.

Next, an amorphous silicon layer is formed on the buffer insulating layer 40 by low pressure chemical vapor deposition (LPCVD) or plasma enhanced chemical vapor deposition (PECVD) method, and the amorphous silicon layer is crystallized to form the active layer 100 and an active extension portion 150. A dehydrogenation process may be performed before the crystallization of the amorphous silicon layer to remove hydrogen present in the amorphous silicon layer.

To crystallize the amorphous silicon layer, a sequential lateral solidification (SLS) method, which is a type of excimer laser annealing (ELA), may be used to improve the crystal size by irradiating a line beam in the horizontal direction to grow the crystal laterally. Alternatively, a general ELA method or other crystallization methods may be used.

Figure 4:
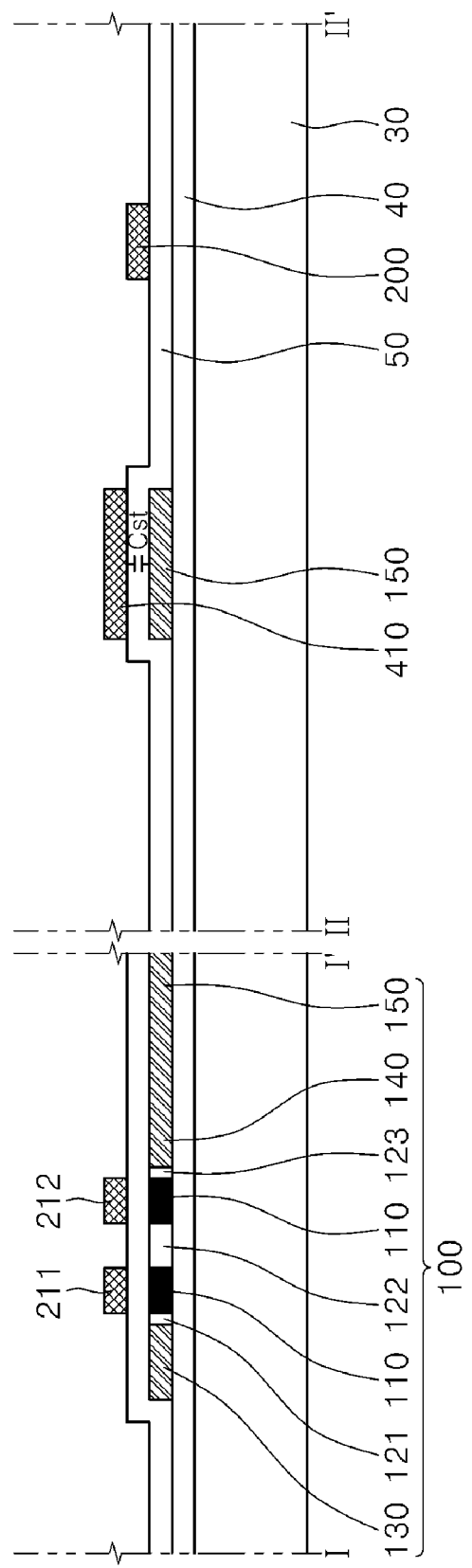

Referring to FIG. 4, a gate insulating layer 50 is formed on the buffer insulating layer 40, the active layer 100, and the active extension portion 150. Then, a gate pattern including a gate line 200, first and second gate electrodes 211 and 212, a storage line 400, and a storage electrode 410 are formed on the gate insulating layer 50 by a second mask process. A second storage line 420 may further be provided.

Next, impurities are doped into a source contact region 130 and a drain contact region 140, and impurities are doped into first, second, and third LDD regions 121, 122, and 123.

In particular, an inorganic insulating material such as $SiN_x$ or $SiO_x$ is deposited on the entire surface of the buffer insulating layer 40, the active layer 100, and the active extension portion 150 to form the gate insulating layer 50.

Then, a gate metal layer including a material such as, but not limited to, chromium (Cr) or a Cr alloy, aluminum (Al) or an Al alloy, molybdenum (Mo) or a Mo alloy, silver (Ag) or an Ag alloy, tungsten (W) or a W alloy, titanium (Ti) or a Ti alloy, is deposited on the gate insulating layer 50 in a single-layer or multilayer structure by a sputtering method. For example, a single-layer of aluminum neodymium (AlNd), an aluminum alloy, or a double-layer of Al and AlNd may be deposited. Next, a photoresist is coated on the gate metal layer and the resulting gate metal layer is patterned by a photolithographic process using a second mask, thus forming a gate pattern in a single-layer or multilayer structure.

Subsequently, n+ impurities are doped into the source contact region 130 and the drain contact region 140 using the photoresist remaining only on the gate pattern as a mask. Then, the photoresist remaining on the gate pattern is removed and n− impurities are doped into the first, second, and third LDD regions 121, 122, and 123.

Thereafter, an activation process is performed so that the n+ impurities can diffuse in the source contact region 130 and the drain contact region 140, and the n− impurities can diffuse in the first, second, and third LDD regions 121, 122, and 123. For activation, a rapid thermal annealing (RTA) method to heat a corresponding region for a short time using a focused lamp may be used. However, other activation methods may be used instead.

Figure 5:
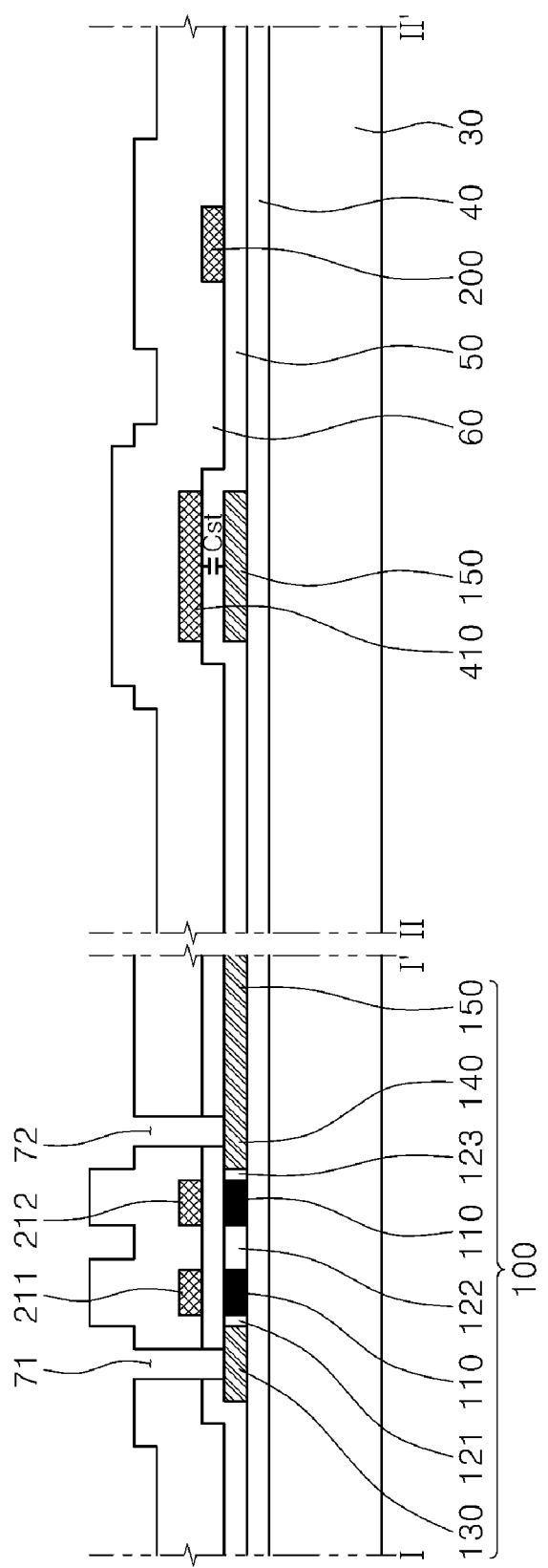

Referring to FIG. 5, an interlayer insulating layer 60 is formed on the gate insulating layer 50 and the gate pattern through a third mask process.

In detail, the interlayer insulating layer 60 is deposited on the gate insulating layer 50 and the gate pattern using an inorganic insulating material, such as $SiN_x$ or $SiO_x$ in a single-layer or multilayer structure, by a PECVD or atmospheric pressure chemical vapor deposition (APCVD) process. Next, source and drain contact holes 71 and 72 that penetrate the interlayer insulating layer 60 and the gate insulating layer 50 are formed by a photolithographic process using a third mask, thus exposing the source contact region 130 and the drain contact region 140, respectively.

Figure 6:
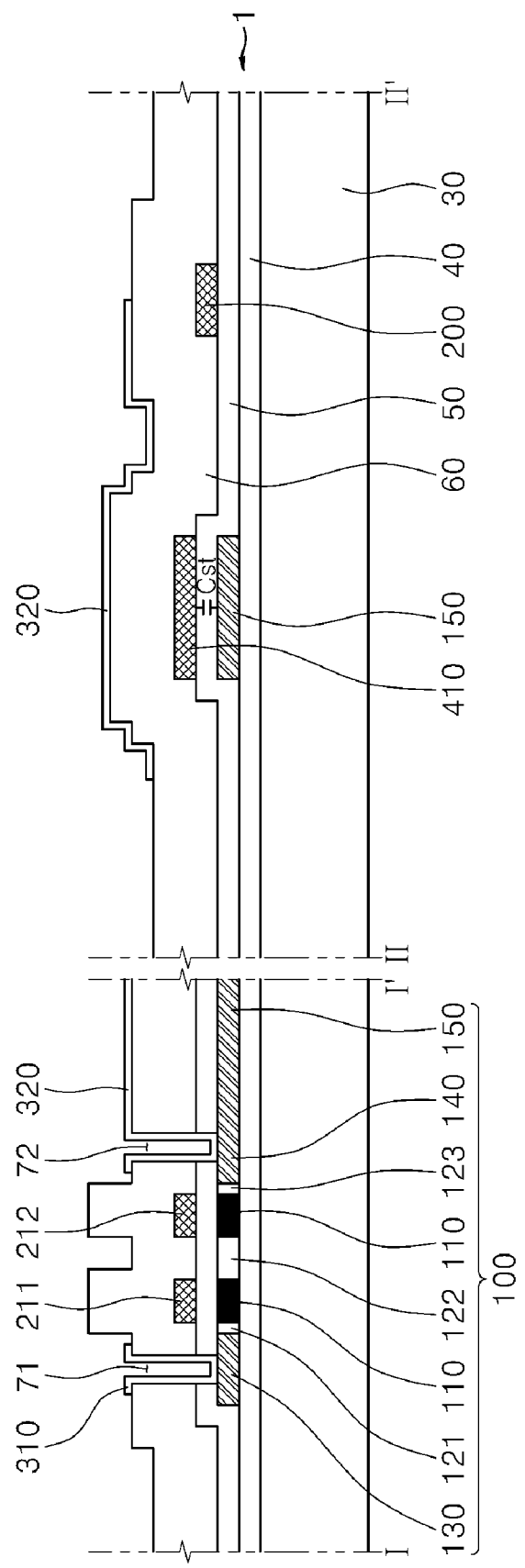

Referring to FIG. 6, a data pattern including a data line 300, a source electrode 310, and a drain electrode 320 is formed.

In particular, a data metal layer including a material such as Cr or a Cr alloy, Al or an Al alloy, Mo or a Mo alloy, Ag or an Ag alloy, W or a W alloy, or Ti or a Ti alloy, is deposited in a single-layer or multilayer structure by a sputtering method. For example, a single-layer of MoW, a triple-layer of Ti/Al/Ti, or a triple-layer of Mo/Al/Mo may be deposited.

Thereafter, an annealing process is performed to recover the characteristics of the channel region 110 that may have been deteriorated due to the deposition process and to improve contact resistance between metals. An RTA method may be used for annealing. Next, a photoresist is coated on the data metal layer and then the data pattern is formed by a photolithographic process using a fourth mask.

Figure 7:
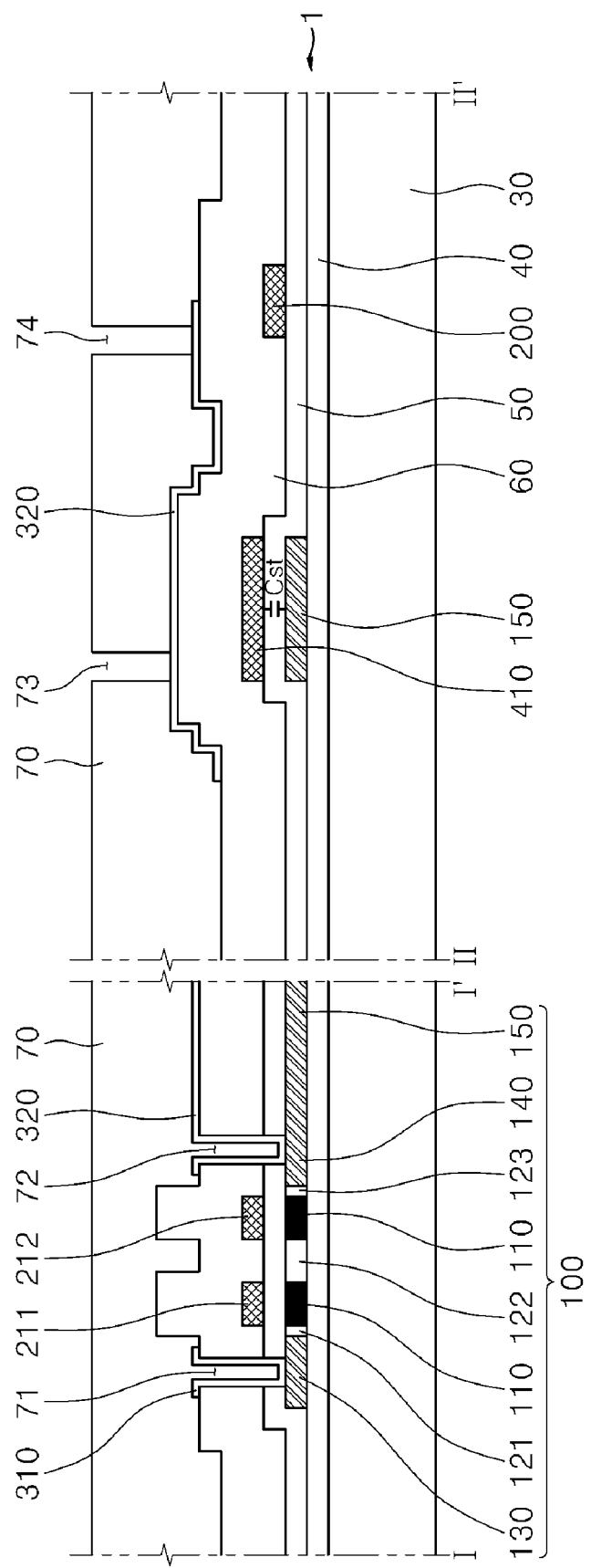

Referring to FIG. 7, an organic protective layer 70 is formed on the data pattern and the interlayer insulating layer 60 by a fifth mask process.

In detail, the organic protective layer 70 is deposited on the data pattern and the interlayer insulating layer 60 by a spin coating method, for example. A photosensitive organic material such as, but not limited to, acrylic, may be used as the organic protective layer 70. Next, first and second contact holes 73 and 74 are formed in the organic protective layer 70 by a photolithographic process using a fifth mask.

In this case, an inorganic protective layer may further be provided before the formation of the organic protective layer 70. The inorganic protective layer may be formed only on the upper surface of the data pattern.

Figure 8:
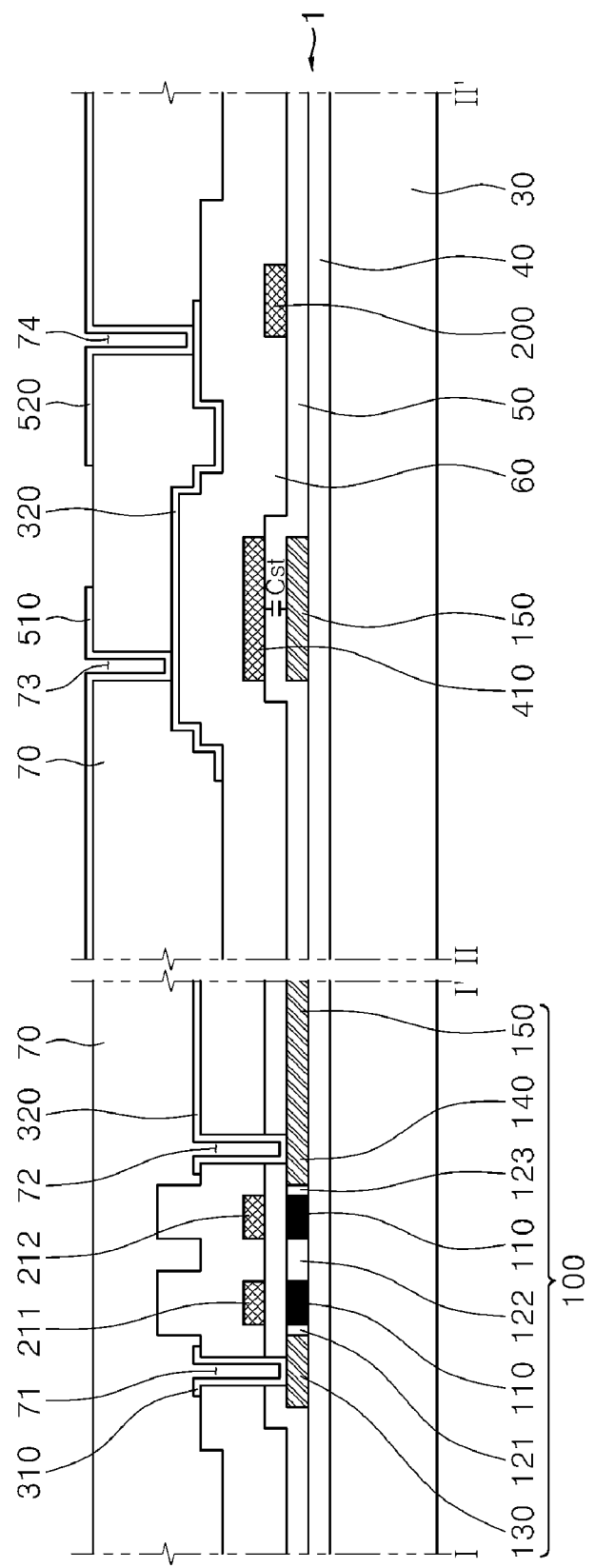

Referring to FIG. 8, a transparent conductive pattern including first and second sub-pixel electrodes 510 and 520 is formed on the organic protective layer 70 by a sixth mask process.

In detail, a transparent conductive metal layer such as indium tin oxide (ITO) or indium zinc oxide (IZO) is deposited on the organic protective layer 70. Thereafter, the transparent conductive metal layer is patterned by a photolithographic process using the sixth mask to form a transparent conductive pattern.

Although a case in which the active layer is formed of polycrystalline silicon has been described with reference to FIG. 3, FIG. 4, FIG. 5, FIG. 6, FIG. 7, and FIG. 8, amorphous silicon may be used as the active layer. In the case where amorphous silicon is used as the active layer, the structure of the thin film transistor may be changed. However, even in the case where the amorphous silicon is used as above, the drain electrode is connected to the first and second sub-pixel electrodes through the contact holes, and thus it may be possible to apply the data signal to the first and second sub-pixel electrodes without the formation of the bridge electrode.

As described above, the display panel and the method of manufacturing the same in accordance with the present invention may prevent an etching defect by directly connecting the drain electrode to the sub-pixel electrodes without the use of a bridge electrode.

Moreover, since a bridge electrode is not used, it may be possible to prevent a display defect due to depression of a spacer used in the LCD panel.

Furthermore, since a mask pattern for forming the bridge electrode is not formed during the manufacture of the display panel, the yield may be improved.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method of manufacturing a display panel, the method comprising:
    forming a gate line to divide a pixel region into a first region and a second region;
    forming a data line to be insulated from the gate line;
    forming a thin film transistor at a crossing of the gate line and the data line, the thin film transistor comprising a drain electrode;
    forming a protective layer on the thin film transistor;
    forming a first contact hole and a second contact hole penetrating the protective layer;
    forming a first sub-pixel electrode on the protective layer and in the first region of the divided pixel region, the first sub-pixel electrode being directly connected to the drain electrode through the first contact hole; and
    forming a second sub-pixel electrode on the protective layer and in the second region of the divided pixel region, the second sub-pixel electrode being directly connected to the drain electrode through the second contact hole,
    wherein the first sub-pixel electrode is directly connected to the second sub-pixel electrode via the drain electrode,
    wherein the forming the gate line comprises forming a gate electrode connected to the gate line, forming a storage line parallel to the gate line, and forming a storage electrode protruding from the storage line,
    wherein the forming the thin film transistor comprises forming an active layer overlapping with the gate electrode, forming a source electrode connected to the data line and one side of the active layer, and forming the drain electrode to face the source electrode, and
    wherein the forming the active layer further comprises forming an active extension portion extending from the active layer and overlapping with the storage electrode.

2. The method of claim 1, wherein the forming the drain electrode further comprises forming the drain electrode to overlap with the active extension portion.

3. The method of claim 1, wherein the forming the gate line further comprises forming a second storage line between a previous pixel region and the pixel region.

4. The method of claim 1, further comprising:
    forming the first sub-pixel electrode to overlap with the storage electrode.

* * * * *